(12) United States Patent
Higashira et al.

(10) Patent No.: US 10,466,615 B2
(45) Date of Patent: Nov. 5, 2019

(54) RUBBER MEMBER FOR COATING DEVELOPING ROLL AND MANUFACTURING METHOD OF DEVELOPING ROLL FOR IMAGE FORMING APPARATUS

(71) Applicants: NOK Corporation, Tokyo (JP); Synztec Co., Ltd., Tokyo (JP)

(72) Inventors: Toshihiro Higashira, Kanagawa (JP); Atsushi Ikeda, Kanagawa (JP); Nozomu Suzuki, Kanagawa (JP); Tomohiro Kondo, Kanagawa (JP); Shinobu Kanzaki, Kanagawa (JP); Goki Inukai, Kanagawa (JP); Lei Wang, Kanagawa (JP); Huu Viet Nguyen, Kanagawa (JP)

(73) Assignees: NOK Corporation (JP); Synztec Co. Ltd. (JP)

( * ) Notice: Subject to any disclaimer, the term of this patent is extended or adjusted under 35 U.S.C. 154(b) by 632 days.

(21) Appl. No.: 15/106,954

(22) PCT Filed: Nov. 6, 2014

(86) PCT No.: PCT/JP2014/079502
§ 371 (c)(1),
(2) Date: Jun. 21, 2016

(87) PCT Pub. No.: WO2015/098310
PCT Pub. Date: Jul. 2, 2015

(65) Prior Publication Data
US 2017/0045840 A1    Feb. 16, 2017

(30) Foreign Application Priority Data
Dec. 27, 2013 (JP) ................. 2013-272887

(51) Int. Cl.
*G03G 15/08* (2006.01)
*C23C 16/22* (2006.01)

(52) U.S. Cl.
CPC ......... *G03G 15/0808* (2013.01); *C23C 16/22* (2013.01); *G03G 15/0818* (2013.01)

(58) Field of Classification Search
CPC . G03C 15/0808; G03C 15/0818; G23C 16/02
See application file for complete search history.

(56) References Cited

U.S. PATENT DOCUMENTS

| 6,270,449 | B1 | 8/2001 | Hirayama |
| 2002/0128138 | A1 | 9/2002 | Hirayama |
| 2004/0170449 | A1 | 9/2004 | Sakata et al. |
| 2009/0245892 | A1 | 10/2009 | Obara et al. |
| 2010/0104316 | A1* | 4/2010 | Hoshio ............. G03G 15/0233 399/100 |

FOREIGN PATENT DOCUMENTS

| CN | 1258027 A | 6/2000 |
| JP | 09269648 | 10/1997 |
| JP | H11-242383 A | 9/1999 |
| JP | 3112489 | 9/2000 |
| JP | 2004-191561 A | 7/2004 |
| JP | 2005258201 | 9/2005 |
| JP | 2005-352017 A | 12/2005 |
| JP | 3952428 | 5/2007 |
| JP | 2007-148100 A | 6/2007 |
| JP | 2007-169411 A | 7/2007 |
| JP | 2009-186584 A | 8/2009 |
| JP | 2010-128080 | * 6/2010 |
| JP | 2010128080 | 6/2010 |
| JP | 5026902 | 6/2012 |
| JP | 2012-252215 A | 12/2012 |
| JP | 5219575 | 3/2013 |

OTHER PUBLICATIONS

International Search Report for Patent Application No. PCT/JP2014/079502 dated Dec. 9, 2014 (5 pages).
Written Opinion for Patent Application No. PCT/JP2014/079502 dated Dec. 9, 2014 (7 pages).
Extended European Search Report for Patent Application No. EP 14875357.7 dated Jun. 6, 2017 (7 pages).
Japanese Office Action for Patent Application No. JP 2015-540950 dated Sep. 25, 2015 (4 pages).
First Chinese Office Action for Patent Application No. CN 201480072933.X dated Nov. 28, 2016 (9 pages).
Second Chinese Office Action for Patent Application No. CN 201480072933.X dated Mar. 31, 2017 (8 pages).
Third Chinese Office Action for Patent Application No. CN 201480072933.X dated Jul. 11, 2017 (7 pages).

\* cited by examiner

*Primary Examiner* — Amina S Khan
(74) *Attorney, Agent, or Firm* — Harness, Dickey & Pierce, P.L.C.

(57) ABSTRACT

A rubber member for coating a developing roll which is obtained by coating a coating layer component around a developing roll having a rubber substrate layer and curing the coating layer component is described. The coating layer component contains: (A) a liquid binder containing at least a polyol, an isocyanate compound and reactive silicone oil; (B) silicone rubber particles having a hardness according to JIS K6253: 1997 by Durometer A, measured instantaneously, of 20 to 80 degrees, and a rubber particle size of 0.2 to 10 pm; and a diluting solvent. A ratio of a thickness of the coating layer after curing and a particle size of the rubber satisfies: the rubber particle size/a coating layer thickness <0.3.

9 Claims, 2 Drawing Sheets

RUBBER MEMBER FOR COATING DEVELOPING ROLL AND MANUFACTURING METHOD OF DEVELOPING ROLL FOR IMAGE FORMING APPARATUS

FIELD OF THE INVENTIONS

The present invention relates to a rubber member for coating a developing roll and a manufacturing method of a developing roll for forming an image forming apparatus, more specifically it relates to a rubber member for coating a developing roll having a coating layer which has a uniform rough surface at the surface of the coating layer, can ensure a sufficient thickness while maintaining flexibility at projected parts, and can realize non-tackiness and low friction, and a manufacturing method of a developing roll for forming an image forming apparatus

BACKGROUND OF THE INVENTIONS

As a developing process of a developing apparatus with a nonmagnetic one component developing system in recent years, it has been known a contact developing system in which a developing roll to which a toner (developer) has been attached is uniformly contacted to a photoreceptor by pressure to carry out the development (see FIG. 3).

In general, an electrostatic latent image is formed onto a surface of a photoreceptor drum based on predetermined image information by the means of the electrostatic latent image, while a toner supply roller supplies the toner onto a surface of a developing roll, a developer amount regulation member (hereinafter also referred to as "regulation blade".) regulates the toner supplied on the developing roll to a uniform thickness, and a uniform thin layer of the toner is formed on the surface of the developing roll.

The toner is successively adhered by the developing roll on the surface of which is formed the toner thin layer to the electrostatic latent image formed on the photoreceptor drum at a nip portion or a proximity part of the photoreceptor drum. Toner development is thus carried out.

For obtaining a uniform and high density image in such a contact development system, it is important to form a toner attached layer which is a uniform and thin layer on the surface of the developing roll. Therefore, it is necessary to sufficiently retain a conveying amount of the toner by forming a uniform rough surface at the surface of the developing roll, and to secure uniform gaps with the regulation blade.

The developing roll generally has a structure in which a rubbery elastomer having conductivity is accumulated at a columnar surface of a core material including a metal, a fibrous material or a resin molded material. And by providing a coating layer including a resin to the surface of the rubbery elastomer, it has been taking measures against (1) the problem that a component contained in the rubber is transferred to the surface, so that a mating member is contaminated, (2) the problem that a volume resistance value is markedly changed by the change in an environment, (3) the problem that coefficient of dynamic friction is large, so that a large torque is required for rotation in relation to the friction with the contacting mating member, (4) the problem of tackiness of the toner, tackiness to a mating member, occurrence of frictional sound, and stain adhesion, etc., due to the characteristics of high tackiness characteristics and high friction coefficient.

In Patent Document 1, it has been disclosed a method of forming a uniform rough surface by dispersing resin particles for the purpose of roughening the surface onto the surface of the developing roll for making the surface of the developing roll a uniform rough surface.

For forming unevenness onto the surface of the developing roll by particles, it is necessary to add many particles, and when hard resin particles occupy almost all the part of the surface of the developing roll, a coating layer itself is hard and projected parts of the coating layer are also hard so that deterioration of the toner proceeds.

When the toner layer is formed, the projected parts of the surface of the developing roll are rubbed particularly by a blade, so that a frictional heat is generated by rubbing whereby it is easily melted. When the toner is melted, there is a problem that filming in which the toner is adhered to the surface of the developing roll easily occurs. The toner is likely melted by deterioration and the problem is easily generated.

Accompanying with high speed and high resolution of an image forming apparatus in recent years, the toner is made low melting point and small diameter, whereby it is more likely melting by heat.

A toner conveying amount can be made large in accordance with the degree of roughness of the surface of the developing roll, so that, in Patent Document 2, it has been disclosed a means to make the particles to be formulated in the surface layer large for the purpose of making roughness of the roll surface large.

However, if the surface roughness becomes too large, roughness of the resulting image or image unevenness is generated, or fogging property is lowered, and it is difficult to form uniform rough surface over the whole part of the roll surface.

If there is fluctuation in roughness of the roll surface, there are fear that the toner conveying amount is deviated and the toner charging amount becomes non-uniform. Further, the surface of the spherical particles is hard since it is a resin, and depending on a kind of the toner, there is a possibility of giving damage to the toner and of generating filming.

In Patent Document 3, Patent Document 4 and Patent Document 5, there are disclosed a means of lowering a surface hardness of recessed parts at which much toner is retained than that of projected parts formed at the surface whereby toner stress is reduced.

However, according to these means, hard particles are contained in the coating layer, so that toner stress is particularly remarkable, whereby sufficient printing durability cannot be obtained.

In Patent Document 6, there is disclosed a technique using a silicone rubber binder as a binder, and polymethyl-silsesquioxane fine particles as resin particles.

In this case, the binder is soft, but the polymethyl-silsesquioxane fine particles are resin particles which are hard and they deteriorate the toner.

Also, the binder is a silicone rubber binder so that adhesiveness with the rubber substrate layer is poor, and filming or tackiness of the toner is generated in some cases.

Further, there is a problem that these resin particles are precipitated during the process of coating them onto a roll surface, so that it is difficult to coat them so as to uniformly exist onto the roll surface.

In Patent Document 7, there is disclosed a coating layer in which particles which comprise a material having low compression set, for example, a silicone resin or a urethane resin is uniformly dispersed in a binder. As the coating layer, a polyurethane resin has been preferably used as a material which can maintain stable friction charge.

However, for projecting small particles to the surface of the coating layer, a thickness of the coating layer must be thin.

Accordingly, in general, it was necessary to make the coating layer thin to cause surface roughness by making the particles small. However, when the coating layer is made thin, there is a problem that the effect of the rubber which is the substrate cannot sufficiently be avoided as mentioned above.

PRIOR ART DOCUMENTS

Patent Documents

[Patent Document 1] JP-A-H09-269648
[Patent Document 2] JP-B-3,112,489
[Patent Document 3] JP-B-5,026,902
[Patent Document 4] JP-B-5,219,575
[Patent Document 5] JP-A-2005-258201
[Patent Document 6] JP-B-3,952,428
[Patent Document 7] JP-A-2010-128080

SUMMARY

In view of the above-mentioned circumstances, as characteristics of the coating layer for coating the rubber substrate layer (elastic rubber layer), it has been required that:
(1) a uniform rough surface is formed onto the surface of the developing roll,
(2) neither damage nor toner stress is given to the mating member or the toner while maintaining flexibility,
(3) a thickness which can sufficiently avoid the effect of the rubber is secured,
(4) non-tackiness and low friction are realized.

Thus, an object of the present invention is to provide a rubber member for coating a developing roll in which (1) a uniform rough surface is formed onto the surface of the developing roll, (2) neither damage nor toner stress is given to the mating member or the toner while maintaining flexibility, (3) a thickness which can sufficiently avoid the effect of the rubber is secured, (4) non-tackiness and low friction are realized.

Also, other objects of the present invention are to provide a manufacturing method of a developing roll for forming an image forming apparatus using the rubber member for coating a developing roll, which can accumulate the rubber particles for coating to an upper portion in the said layer even when the thickness of the coating layer is made thick, and is capable of solving the above-mentioned problems.

The other objects of the present invention would be clear from the following descriptions.

Means for Solving Problem

The above-mentioned problems are solved by the respective inventions in the following.

1. A rubber member for coating a developing roll which is obtained by coating a coating layer component around a developing roll having a rubber substrate layer and curing the coating layer component, and the coating layer component comprises:
(A) a liquid binder containing at least a polyol, an isocyanate compound and reactive silicone oil,
(B) silicone rubber particles having a hardness according to JIS K6253: 1997 by Durometer A, instantaneous, of 20 to 80 degree, and a rubber particle size of 0.2 to 10 μm, and
(C) a diluting solvent, and a ratio of a thickness of the coating layer after curing and a particle size of the rubber satisfies: the rubber particle size/a coating layer thickness<0.3.

2. The rubber member for coating a developing roll according to 1, wherein the diluting solvent used is a diluting solvent which swells the rubber particles.

3. The rubber member for coating a developing roll according to 1 or 2, wherein the polyol is a fluorine-containing polyol.

4. The rubber member for coating a developing roll according to any one of 1 to 3, wherein the rubber particles are present 200 or more per 50 μm2 at the surface of the coating layer.

5. The rubber member for coating a developing roll according to any one of 1 to 4, wherein a surface of the coating layer is formed to a projected state by the presence of the rubber particles, and a height of projected parts which constitute the projected state is in the range of 0.5 to 8.0 μm.

6. The rubber member for coating a developing roll according to any one of 1 to 4, wherein a surface of the coating layer is formed to a projected state by the presence of the rubber particles, an interval between the rubber particles is less than 5 μm, and the rubber particles are present in a state that 5 or more particles are aggregated.

7. A manufacturing method of a developing roll for forming an image forming apparatus comprising the steps of:
coating and forming a rubber substrate layer around a core material;
forming a coating layer around the rubber substrate layer;
mixing and dispersing a binder containing at least a polyol, an isocyanate compound and reactive silicone oil, and the component of the coating layer containing a diluting solvent to prepare a dispersion;
mixing and dispersing rubber particles having a hardness measured by JIS K6253: 1997 by Durometer A at instantaneous of 20 to 80 degree and spherical silicone rubber particles of 0.2 μm or more and less than 10 μm to the dispersion to prepare a dispersion for coating; and
coating the dispersion for coating at around the elastic rubber layer and curing the same after drying to form a coating layer.

8. The manufacturing method of a developing roll for forming an image forming apparatus according to 7, wherein for forming the coating layer, after coating the dispersion for coating, a liquid state is maintained for a certain period of time to move the rubber particles to an upper layer portion of the layer and then it is cured.

9. The manufacturing method of a developing roll for forming an image forming apparatus according to 8, wherein at the time of moving the rubber particles into an upper layer portion of the layer, the rubber particles are so moved that a surface thereof becomes such a state that a changed ratio of surface exposed particles before and after curing the coating layer obtained by the following calculation formula becomes 500% or more:

Calculation Formula of Changed Ratio of Surface Exposed Particles:

Changed ratio of surface exposed particles=(Number of surface particles after curing−number of surface particles before curing)/number of surface particles before curing×100% wherein the number of the surface particles is a value by photographing optional three portions of a surface of a coating layer with a magnification of 3,000-fold using a laser microscope VK-9700 manufactured by Keyence Corporation and measuring a number of rubber particles in the range of 50 μm×50 μm of an image.

Effect of the Invention

According to the present invention, it can be provided a rubber member for coating a developing roll having a coating layer which has a uniform rough surface at a surface of the rubber member, can secure a sufficient thickness without inhibiting softness (followability) of the rubber substrate layer, while maintaining flexibility at projected parts, without contaminating a surrounding part, and can realize non-tackiness and low friction, and a manufacturing method of a developing roll for forming an image forming apparatus using the rubber member for coating a developing roll.

DESCRIPTION OF THE PREFERRED EMBODIMENTS

In the following, embodiments of the present invention are explained.

Figure 1:
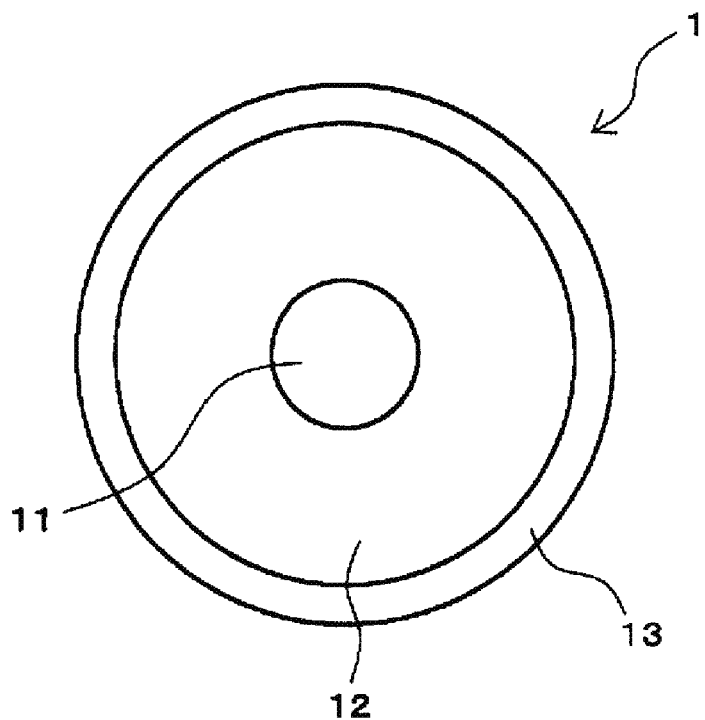
FIG. 1 is a sectional view of a surface perpendicular to the longitudinal direction of an example of a developing roll to which the present invention can be applied.
Figure 2:
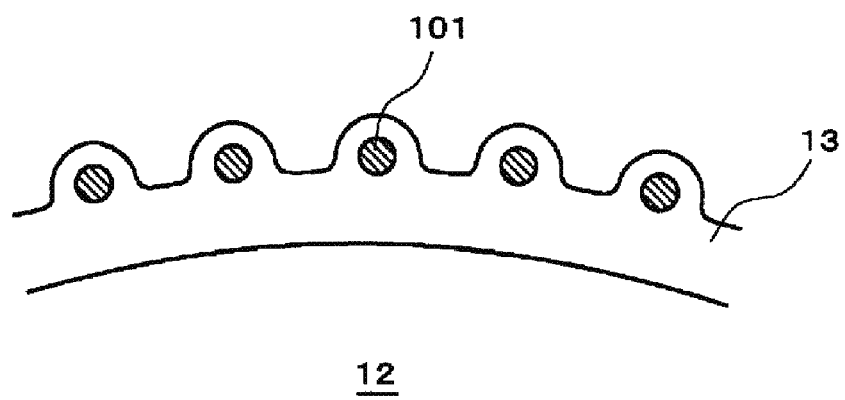
FIG. 2 is an enlarged sectional view of a main part of the coating layer constituting the rubber member for coating a developing roll according to the present invention.
Figure 3:
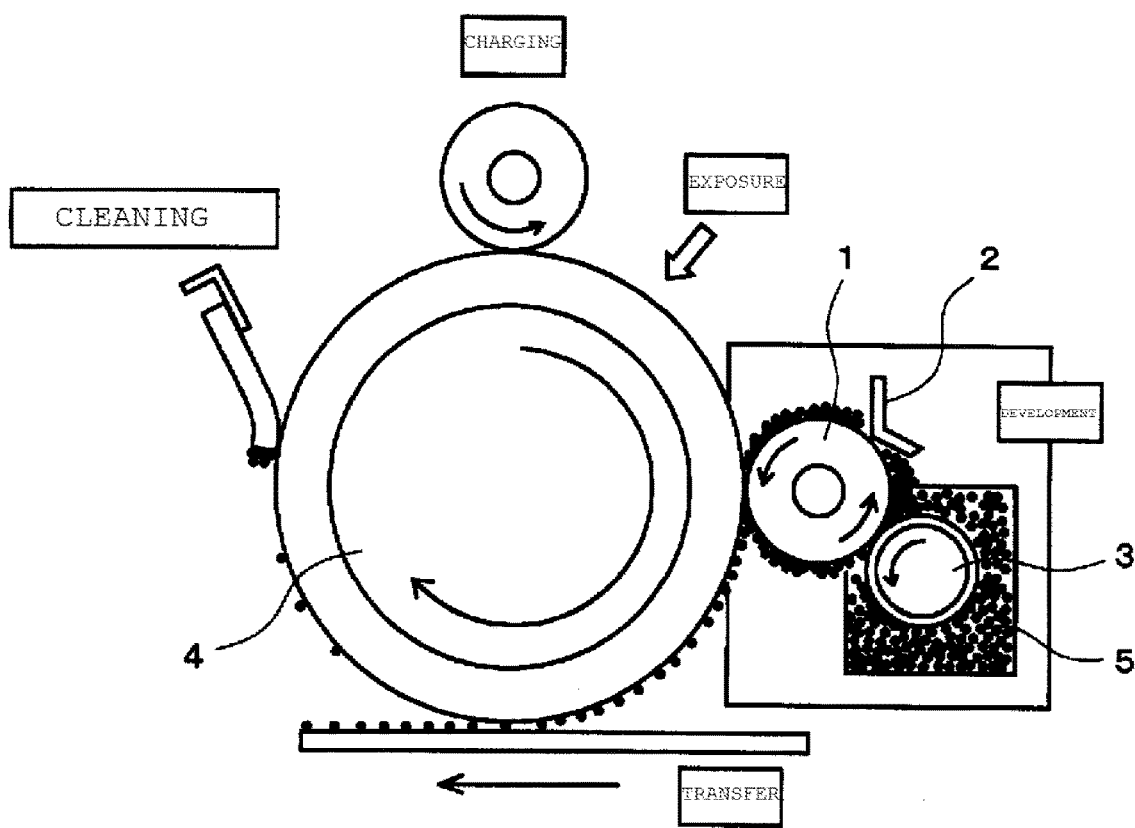
FIG. 3 is a schematic view of an example of the developing apparatus which uses the developing roll according to the present invention

FIG. 1 is a sectional view of a surface perpendicular to the longitudinal direction of an example of a developing roll to which the present invention can be applied. FIG. 2 is an enlarged sectional view of a main part of the coating layer constituting the rubber member for coating a developing roll according to the present invention.

The rubber member for coating a developing roll of the present invention can be obtained by coating the coating layer component around the developing roll having the rubber substrate layer and curing the same.

As shown in the drawing, the developing roll 1 includes a core material 11, around of which being formed at least one layer of a rubber substrate layer 12, and a coating layer 13 being further formed around the rubber substrate layer 12.

1. Explanation of Rubber Substrate Layer

The rubber substrate layer of the developing roll may be mentioned a silicone rubber, a polyurethane-based elastomer, an ethylene-propylene-diene rubber (EPDM), a styrene-butadiene rubber (SBR), an acrylonitrile-butadiene rubber (NBR), a hydrogenated acrylonitrile-butadiene rubber (HNBR), a chloroprene rubber (CR), an epichlorohydrin rubber (ECO), etc., but it is not particularly limited.

In the present invention, a silicone rubber is preferably used in the points of having low hardness and little permanent set.

Also, various kinds of additives such as a conductive agent, a filler, an extender, a reinforcing agent, a processing aid, a curing agent, a vulcanizing accelerator, a crosslinking agent, a crosslinking aid, an antioxidant, a plasticizer, an UV absorber, a pigment, silicone oil, an auxiliary, a surfactant, etc., may be optionally added to the rubber substrate layer, depending on necessity.

As the conductive agent, a conventionally known conductive agent such as an ionic conductive agent and an electronic conductive agent, etc., may be used.

As the ionic conductive agent, there may be mentioned a salt of the group 1 metal of the Periodic Table such as $LiCF_3SO_3$, $NaClO_4$, $LiClO_4$, $LiAsF_6$, $LiBF_4$, NaSCN, KSCN, NaCl, etc.; a salt of the group 2 metal of the Periodic Table such as an ammonium salt including $NH_4Cl$, $(NH_4)_2SO_4$, $NH_4NO_3$, etc., $Ca(ClO_4)_2$ and $Ba(ClO_4)_2$; a complex of these salts and a polyvalent alcohol such as 1,4-butane diol, ethylene glycol, polyethylene glycol, propylene glycol, polypropylene glycol and a derivative thereof; a complex of these salts and a monool such as ethylene glycol monomethyl ether, ethylene glycol monoethyl ether, polyethylene glycol monomethyl ether and polyethylene glycol monoethyl ether; a cationic surfactant such as a quaternary ammonium salt, etc.; an anionic surfactant such as an aliphatic sulfonic acid salt, an alkyl sulfuric acid ester salt, alkyl phosphoric acid ester salt, etc.; and an amphoteric surfactant such as betaine, etc.

As the electronic conductive agent, there may be mentioned a carbon-based substance such as carbon black, graphite; a metal or an alloy such as aluminum, silver, gold, a tin-lead alloy, a copper-nickel alloy; a metal oxide such as zinc oxide, titanium oxide, aluminum oxide, tin oxide, antimony oxide, indium oxide, silver oxide; and a substance in which a conductive metal such as copper, nickel, silver, etc., is subjected to plating to various kinds of a filler, etc.

These conductive agents including the ionic conductive agent and the electronic conductive agent may be used alone or in admixture of two or more kinds in the form of a powder state or a fibrous state. Among these, carbon black is preferably used from the viewpoints that control of conductivity is easy and it is economical.

2. Explanation of Coating Layer

In the present invention, the coating layer component includes:

(A) a liquid binder containing at least a polyol, an isocyanate compound and reactive silicone oil, (B) silicone rubber particles having a hardness (JIS K6253: 1997) by Durometer A (instantaneous) of 20 to 80 degree, and a rubber particle size of 0.2 μm or more and less than 10 μm, and (C) a diluting solvent.

Binder

The binder to be used in the present invention may be mentioned a binder having adhesiveness, preferably a rubber binder having hardness (JIS K6253: 1997) by Durometer A (instantaneous) of 20 to 90 degree, and specifically includes a reaction product of a polyol with an isocyanate compound and a reactive silicone oil.

In keeping with the materials of the rubber substrate layer of the developing roll, an adhesive (a primer) to treat rubber or the rubber surface may be further used.

The binder to be used in the present invention is a liquid material. A binder in a liquid material is preferably used, since silicone rubber particles are separated from the liquid state binder having poor mutual solubility, and the rubber particles are transferred to the surface of the coating layer, so that projected parts are uniformly formed onto the surface of the coating layer even when it is a coating layer thicker than the rubber particle size.

When a coating layer is to be formed onto the rubber substrate layer through a primer, it is necessary to obtain a plane film onto the surface of the primer, so that the primer is optionally selected depending on the applied rubber substrate layer and the binder, and a primer of an isocyanate-based, a silane-based, or a silicone-based, etc., is selected.

The polyol to be used in the present invention is preferably a liquid material at normal temperature (20 to 30° C.), and various kinds of polyols may be used. It is required to have an electrostatic property, and such a polyol is preferably a material capable of forming a coating layer (polyurethane) having a large friction electrostatic charging series by reacting with an isocyanate compound.

Such a polyol may be preferably exemplified by a polyether polyol such as a polyalkylene glycol including polyethylene glycol, polypropylene glycol, tetramethylene glycol, a copolymer thereof, etc.

Among these, a fluorine-containing polyol is particularly preferred. The fluorine-containing polyol is not only forming a coating layer having a larger friction electrostatic charging series by reacting with an isocyanate compound, but also reducing an environmental dependency of the resistance of the forming coating layer. When the fluorine-containing ratio of the fluorine-containing polyol becomes large, the friction electrostatic charging series becomes negatively large.

Such a fluorine-containing polyol may be preferably exemplified by a copolymer comprising an ethylene trifluoride monomer as a main starting material (a copolymer polyol containing an ethylene trifluoride monomer unit as a main component), a copolymer comprising an ethylene tetrafluoride monomer as a main starting material (a copolymer polyol containing an ethylene tetrafluoride monomer unit as a main component).

These fluorine-containing polyols to be used may be a commercially available product, and preferably mentioned "ZEFFLE" available from Daikin Industries, Ltd. (a copolymer polyol containing an ethylene tetrafluoride monomer unit as a main component), "LUMIFLON" available from Asahi Glass Co., Ltd. (a copolymer polyol containing a trifluoromonohaloethylene monomer unit as a main component), and "DEFENSA" available from DIC Corporation.

These fluorine-containing polyols includes, for example, an ethylene tetrafluoride monomer as a main starting material, and contain at least 2 mole of a copolymerized hydroxy monocarboxylic acid ester of acrylic acid and/or a glycol monoester of acrylic acid in total.

To these fluorine-containing copolymer polyols is provided an OH component (OH of a carboxyl group in the hydroxy monocarboxylic acid ester of acrylic acid, glycol OH which is not esterified in the glycol monoester of acrylic acid) by the above-mentioned acrylate monomer.

In the present invention, a copolymer polyol containing an ethylene tetrafluoride monomer as a main component is particularly preferably used.

The isocyanate compound to be used in the present invention may be preferably mentioned a diisocyanate such as diphenylmethane diisocyanate (MDI), tolylene diisocyanate (TDI), hexamethylene diisocyanate (HDI), etc., and their biuret-modified products, isocyanurate-modified products, urethane-modified products, etc.

Particularly preferred isocyanate compounds are hexamethylene diisocyanate and its biuret-modified product, isocyanurate-modified product, urethane-modified product, etc. The isocyanate compound can form a polyurethane coating layer having higher flexibility as the molecular chain thereof is longer.

The reactive silicone oil to be used in the present invention may be mentioned a reactive silicone oil having an active hydrogen(s) which can react with an isocyanate compound.

The reactive silicone oil having an active hydrogen may be mentioned, for example, silicone oil having an amino group (primary and/or secondary amino group), silicone oil having a mercapto group, silicone oil having a hydroxyl group (for example, silicone oil having a carboxyl group, silicone oil having a phenolic OH group, silicone oil having an alcoholic OH group), etc.

These reactive silicone oils are commercially available as amino-modified silicone oil, mercapto-modified silicone oil, carboxyl-modified silicone oil, phenol-modified silicone oil, carbinol-modified silicone oil, etc.

In the present invention, any of the silicone oils having the above-mentioned reactive organic group at one of the terminals or both of the terminals, and/or at the side chain may be used.

More preferred reactive silicone oil may be a material represented by the following general formula (1) or (2).

[Formula 1]

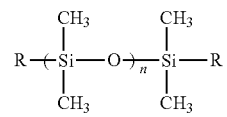

general formula (1)

[Formula 2]

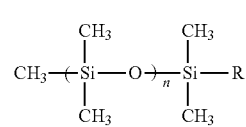

general formula (2)

In the above-mentioned general formulae (1) and (2), each R represents —$C_3H_6OC_2H_4OH$ or —$C_3H_6OCH_2$—$C(CH_2OH)_2C_2H_5$, and n is an integer of about 20 or less.

Particularly preferred reactive silicone oil is silicone oil of the general formula (1) wherein each R is —$C_3H_6OC_2H_4OH$, and among these, a material wherein n is about 10 is particularly preferred. Such a reactive silicone oil is also commercially available.

In addition, silicone oil having a hydrogen bonded to the silicon of the silicone skeleton may also be used.

By adding the reactive silicone oil, an effect of softening the binder component can be obtained. For the purpose of not giving stress to the toner, the binder component is preferably as soft as possible, and tackiness can be made small by lowering the hardness preferably with the addition of a fluorine elastomer or silicone oil rather than lowering the hardness with a urethane binder.

Also, it is preferable to keep the coating layer soften, as it can follow deformation of the substrate rubber layer. If the coating layer cannot easily follow to deformation of the rubber, etc., crack is generated at the coating layer, a rubber formulating agent exudes from the cracks, the toner is attached to the cracks or the friction coefficient changes, so that there is a case where the objects as a roller cannot be accomplished at an early stage.

Silicone Rubber Particles

The silicone rubber particles to be used in the present invention is preferably a structure in which an organopolysiloxane such as a dimethylpolysiloxane, etc., or a polyorganosilsesquioxane is crosslinked, but the invention is not particularly limited by these. In addition, commercially available silicone rubber particles may be used.

In the rubber member for coating a developing roll, a conveying amount of the toner and the rubber particle size thereof can be matched in keeping with the size and shape of the toner within the range so that the toner is not entered into a concavity, and in the present invention, a particle size of the silicone rubber particles is preferably 0.2 µm to 10 µm, more preferably 0.8 µm to 5 µm.

If the particle size of the silicone rubber particles is less than 0.2 µm, unevenness cannot be formed onto the surface of the coating layer, and the toner at the time of printing and the particles cannot be point-contacted. Then, impact absorption of the toner (contact resistance cannot be made small) cannot be done, and deterioration of the toner proceeds whereby it is not preferred.

If the particle size of the silicone rubber particles exceeds 10 µm, the projected parts of the surface of the coating layer formed by the particles become too high, whereby the toner conveying amount is too large, or the toner hits against the projected surface of the rubber particles, so that deterioration of the toner proceeds whereby it is not preferred.

Also, if the particles are too large, the surface roughness becomes remarkable, roughness of the resulting image or image unevenness is generated, or fogging property is lowered in some cases.

Further, if the particles are too large, it is difficult to form uniform roughness over the whole surface of the coating layer. If there is fluctuation in roughness of the roll surface, there are fear that the toner conveying amount is deviated, and the toner charging amount becomes non-uniform.

The hardness by Durometer A (instantaneous) (JIS K6253: 1997) of the silicone rubber particles is preferably 20 to 80 degree, more preferably 50 to 75 degree, and is optionally selected depending on the unevenness state of the surface, etc.

If the hardness by Durometer A (instantaneous) becomes less than 20 degree, when they are contacted with a mating member, the shape of the rubber particles cannot be retained, and the silicone rubber itself is broken, or it cannot be returned to the original size, so that a friction coefficient of the coating layer is heightened, which generates tackiness, whereby it is not preferred.

If the hardness by Durometer A (instantaneous) exceeds 80 degree, stress is imparted to a mating member, the hardness of the coating layer itself is heightened, which causes crack or fracture of the coating layer so that it is not preferred.

Also, damage, toner stress, etc., are imparted to the toner so that it is not preferred.

The silicone rubber particles to be used in the present invention are a material comprising a silicone cured product having rubber elasticity, which has a linear organopolysiloxane block represented by the general formula (3) in the molecular structural formula.

[Formula 3]

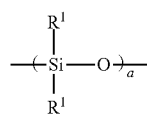

general formula (3)

In the general formula (3), $R^1$ represents a group selected from one or more monovalent organic groups having 1 to 20 carbon atoms selected from the group consisting of an alkyl group such as a methyl group, an ethyl group, a propyl group, a butyl group, etc., an aryl group such as a phenyl group, a tolyl group, etc., an alkenyl group such as a vinyl group, an allyl group, etc., an aralkyl group such as a β-phenylethyl group, a β-phenylpropyl group, etc., a monovalent halogenated hydrocarbon group such as a chloromethyl group, a 3,3,3-trifluoropropyl group, etc., and further an organic group containing a reactive group such as an epoxy group, an amino group, a mercapto group, an acryloxy group, a methacryloxy group, etc., and preferably 90 mole % or more thereof is a methyl group.

The recurring number a is preferably an integer of 5 to 5,000, more preferably an integer of 10 to 1,000.

If a is less than 5, the characteristic feature of the linear organopolysiloxane is not sufficiently revealed, so that the effects of lowering the hardness and improvement of lubricity cannot sufficiently be obtained. While the maximum value of a is not particularly defined, but it is actually larger than 5,000, the silicone rubber fine particles can be difficultly manufactured.

Curing is carried out by crosslinking which is general in the silicone rubber, and preferably carried out by the addition reaction.

Manufacture of the silicone rubber particles may be carried out, at the time of the reaction and curing, by the method in which they are cured in a high temperature spray drying, the method in which they are cured in an organic solvent, or the method in which they are emulsified and then cured, etc. Among these, the method in which they are cured in emulsion particles of the silicone is preferably used since the manufacture of the silicone rubber fine particles of the present invention uses silicone rubber spherical fine particles as an aqueous dispersion.

The silicone rubber particles to be used in the present invention may be mentioned a resinous polymerized product using an organosilsesquioxane unit represented by the general formula (4) as a constitutional unit.

General Formula (4)

$$R^2—SiO_{3/2}$$ [Formula 4]

In the above-mentioned formula (4), $R^2$ represents a group selected from one or more monovalent organic group having 1 to 20 carbon atoms and containing a reactive group selected from the group consisting of an alkyl group such as a methyl group, an ethyl group, a propyl group, a butyl group, etc., an aryl group such as a phenyl group, a tollyl group, etc., an alkenyl group such as a vinyl group, an allyl group, etc., an aralkyl group such as a β-phenylethyl group, a β-phenylpropyl group, etc., a monovalent halogenated hydrocarbon group such as a chloromethyl group, a 3,3,3-trifluoropropyl group, etc., and further an epoxy group, an amino group, a mercapto group, an acryloxy group, a methacryloxy group, etc.

The polyorganosilsesquioxane resin or a material formed by the other surface treatments may be coated on the whole surface of the rubber particles or may be coated on part of the surface.

The organoalkoxysilane represented by the following general formula (5) may be subjected to the surface treatment onto the surface of the silicone rubber spherical particles to be used in the present invention.
General Formula (5)

$$R^2—Si(OR^3)_3$$ [Formula 5]

In the above-mentioned formula (5), $R^2$ represents a monovalent organic group which is the same as in the above-mentioned general formula (4), and $R^3$ represents an alkyl group having 1 to 6 carbon atoms such as a methyl group, an ethyl group, a propyl group, a butyl group, etc.

There may be used, for example, methyltrimethoxysilane, methyltriethoxysilane, methyltripropoxysilane, methyltributoxysilane, ethyltrimethoxysilane, propyltri-methoxysilane, butyltrimethoxysilane, N-(β-aminoethyl)-γ-aminopropyltrimethoxysilane, γ-glycidoxypropyltrimethoxysilane, vinyltrimethoxysilane, phenyltrimethoxysilane, γ-methacryloxypropyltrimethoxysilane, γ-mercaptopropyl-trimethoxysilane 3,3,3-trifluoropropyltrimethoxysilane, 3,3,4,4,5,5,6,6,6-nonafluorohexyltrimethoxysilane, 3,3,4,4,5,5,6,6,7,7,8,8,9,9,10,10,10-heptadecafluoro-decyltrimethoxysilane, etc., and these may be used singly or in combination of two or more kinds.

If an organoalkoxysilane is used in combination, it can be expected to further improve compatibility, lubrication characteristics, etc., of the resulting silicone particles to the substrate.

The rubber particles can be dispersed with the binder by means of, using media, a ball mill, an attritor, a basket mill, a sand mill, a sand grinder, a dyno mill, a disperser mat, an SC mill, a spike mill, an agitator mill, etc., and without using media, by ultrasonic wave, a homogenizer, an ultrasonic wave homogenizer, a nanomizer, a dessolver, a disperser, a high speed impeller disperser, etc.

The surface of the silicone rubber particles may be subjected to the treatment by a silane coupling agent, silica, a metal oxide, etc., in some cases for the purpose of providing non-tackiness, lubricity, abrasion resistance, and preventing aggregation.

The commercially available product may be mentioned, for example, silicone rubber particles in which dimethylpolysiloxanes excellent in impact absorption resistance have been crosslinked such as "KMP-597" available from Shin-Etsu Chemical Co., Ltd., etc., "EP-5500" (average particle diameter: 3 μm, rubber hardness: JIS-A30 degree, no functional group), "EP-2600" (average particle diameter: 2 μm, rubber hardness: JIS-A40 degree, no functional group), "EP-2601" (average particle diameter: 2 μm, rubber hardness: JIS-A40 degree, functional group: epoxy group), "E-2720" (average particle diameter: 2 μm, rubber hardness: JIS-A70 degree, functional group: methacryl group), "DY33-430M" (average particle diameter: 4 μm, rubber hardness: JIS-A30 degree, no functional group) all of which are available from Dow Corning Toray Co., Ltd., "EP-2720", "EP-9215 Cosmetic Powder", "9701 Cosmetic Powder" all of which are available from Dow Corning Toray Co., Ltd., etc.

Diluting Solvent

The diluting solvent may include an aqueous system and an organic solvent system, and a low-boiling point solvent and a high-boiling point solvent may be used in combination depending on a drying speed.

In the coating liquid including a dispersion and rubber particles for forming the coating layer of the present invention, a concentration ratio of the solid contents to the diluting solvent is preferably in the range of 3 to 50 wt %, more preferably 5 to 30 wt %. If the concentration of the solid contents is low, liquid dripping is generated at the time of coating and drying is delayed, while if the concentration is high, control of roughness of the coating surface or the thickness thereof is difficultly controlled.

When a diluting solvent for which the rubber particles swell is used, the rubber particles are swollen in the coating liquid, and it is possible to eliminate marble or concavity of the coating layer.

In addition, precipitation of the rubber particles can be delayed in the coating liquid, so that coating can be carried out so that the particles are uniformly projected to the rubber surface.

The diluting solvent to be used for swelling the rubber particles may be preferably mentioned an organic solvent such as methyl ethyl ketone (MEK), methyl isobutyl ketone (MIBK), tetrahydrofuran (THF), acetone, ethyl acetate, butyl acetate, toluene, xylene, heptane, cyclohexanone, isophorone, etc. After coating, a heating temperature and a time are optionally set so that the size of the rubber particles returns to the original one by heating.

Formulation Amount

As a formulating prescription of the coating liquid constituting the coating layer of the present invention, the silicone rubber particles are preferably contained in the range of 3 to 30% by weight in terms of % by weight of the solid content (solid content ratio), more preferably 5 to 20% by weight.

If the solid content ratio of the silicone rubber particles exceeds 30% by weight, the hardness of the coating layer surface is lowered, many convex shapes are formed at the surface, and non-tackiness and lower friction are promoted, but there are problems of lowering abrasion resistance, lowering strength of the film, lowering adhesiveness to the rubber substrate layer and heightening the toner conveying amount so that it is not preferred.

If the solid content ratio of the formulated rubber is less than 3% by weight, convex portion is not formed at the surface of the coating layer of the rubber particles, so that non-tackiness and lower friction are impaired, reduction of stress to a mating member is lost, and printing failure is caused whereby it is not preferred.

The isocyanate compound is preferably in the range of 10 to 70% by weight in terms of % by weight of the solid content, more preferably 30 to 60% by weight. If it is less than 10% by weight, adhesiveness of the rubber, and strength and abrasion resistance thereof are lowered. If it exceeds 70% by weight, deterioration of the toner promotes, tackiness with the toner and printing characteristics due to embedding of the rubber particles to be added are worsened, so that it is not preferred.

The polyol (for example, fluorine-containing polyol) is preferably in the range of 10 to 40% by weight in terms of % by weight as a solid content, more preferably 10 to 30% by weight.

If it is less than 10% by weight, there are problems of worsening coating property and tackiness to the toner. If it exceeds 40% by weight, there are problems of worsening adhesiveness of the rubber or abrasion resistance, and inhibition of transfer the rubber particles to the surface, so that it is not preferred.

The reactive silicone oil is preferably in the range of 10 to 70% by weight in terms of % by weight as a solid content, more preferably 30 to 60% by weight.

If it is less than 10% by weight, there are problems of worsening tackiness with the toner, and film flexibility, etc. If it exceeds 70% by weight, there are problems of worsening coating property, occurrence of dimple, worsening abrasion resistance, etc., so that it is not preferred.

Coating Layer Hardness

The hardness of the coating layer is preferably so adjusted by the binder that the hardness (JIS K6253: 1997) by Durometer A (instantaneous) becomes 20 to 80 degree.

Deterioration of the toner can be prevented by adjusting the hardness of the coating layer similar to the hardness of the rubber. If the hardness (JIS K6253: 1997) by Durometer A (instantaneous) is less than 20 degree, there are problems of worsening abrasion resistance of the binder, occurrence of tackiness, etc.

Surface Shape

As the shape of the coating layer surface, surface unevenness is formed by the silicone rubber particles accumulated onto the surface.

The above-mentioned rubber particles are preferably present 200 particles or more per 50 μm$^2$ at the surface of the coating layer. A number of the rubber particles exposed to the surface can be determined by the particle size and an amount of the rubber particles.

When the particle size is 0.2 to 10 μm, the number of the rubber particles in 50 μm$^2$ is preferably 200 particles or more, more preferably 500 particles or more. If it is less than 200 particles, the rubber particles can less form unevenness at the surface as mentioned above, point contact of the toner and absorption of impact of the toner at the time of printing cannot be done whereby deterioration of the toner proceeds.

In the case that a counterpart is a resin or a metal which has a smooth surface, it is better to have a larger particle size and an aggregation size in accordance with a surface pressure, and it is better that there is a gap between the particles with a certain extent.

When the counterpart is a toner, the particles size is determined in keeping with the size of the toner and the conveying amount, it is better that interval between the particles and the gaps are narrow since the toner is not incorporated into the gaps, and the particles are preferably in an aggregated state.

A projected height of the surface is preferably 0.5 to 8.0 μm. If it is smaller than 0.5 μm, the toner and the particles are not in point contact, and resistance of the toner cannot be made small, so that it is not preferred. If it is larger than 8.0 μm, the toner is incorporated into the gaps between the particles, and the toner stress becomes large, so that it is not preferred.

There are a case where the projected part is formed by one spherical particle, and a case where the projected part is formed by aggregated particles.

When the projected part is formed by aggregating rubber particles, it is preferred that a width at the opening part of concavity between the rubber particles at the rubber particles aggregated portion is 10 μm or less, and a depth is less than 5 μm.

The particles are preferably in the state in which particles which are smaller than the toner particle size are present at the surface, and support the toner at a point.

In the present invention, a ratio of the "rubber particle size/coating layer thickness" preferably satisfies the above-mentioned rubber particle size/coating layer thickness<0.3.

The coating layer thickness is preferably 5 μm or more, and as it is thicker, the rubber particles existing in the coating layer increase and the effects of relaxing stress of the toner and impact absorption are increased, so that it is preferred.

Also, by being maintained the coating layer thickness with a certain degree or more, a thickness which can sufficiently avoid the problems of tackiness of the toner, tackiness to a mating member, occurrence of frictional sound, and stain adhesion, etc., due to the characteristics of the rubber such as tackiness characteristics and high friction coefficient, can be ensured, so that it is preferred.

When the particle size is large, the thickness is thick and the ratio of the "rubber particle size/coating layer thickness" exceeds 0.3, or when the particle size is large, the thickness is thin and the ratio exceeds 0.3, the gaps between the rubber particles at the coating layer surface becomes large and the toner is incorporated into the gaps whereby toner stress becomes large, so that it is not preferred.

When the particle size is small, the thickness is thin and the ratio exceeds 0.3, many part of the rubber particles at the coating layer surface is buried in the binder, the toner and the particles are not in a point contact, and resistance of the toner cannot be made small.

When the particle size is small, the thickness is thick, the ratio exceeds 0.3 and the number of the rubber particles is less than 200, many part of the rubber particles at the coating layer surface is buried in the binder, the toner and the particles are not in a point contact, and resistance of the toner cannot be made small.

When the number of the rubber particles is less than 200 and the ratio of the "rubber particle size/coating layer thickness" is 0.3 or more, gaps between the rubber particles at the coating layer surface become large, the toner is incorporated into the gaps and the toner stress becomes large.

It is preferred that the ratio of the "rubber particle size/coating layer thickness" is less than 0.3, and in the case where it is 0.3 or more and the particle size is large, there are problems as mentioned above. When the thickness is thin, the roll polishing surface cannot be buried, or a trace of a step difference by polishing is attached at the time of printing, and it is thin, exposure of the particles is increased, and a toner conveying amount is large. In addition, when it is thin, unevenness by polishing of the rubber cannot be buried by the coating, which causes deterioration of the toner. Moreover, the problem occurs that abrasion resistance is lowered.

When the rubber particles are uniformly present at the coating layer surface, the particle portion becomes non-tackiness and low friction, whereby hardness of the surface is lowered.

When the particles are in the projected state (convex state) from the coating layer, more effects can be exerted, and they become in a point contact with a mating member or the toner.

However, when a heavy load or shear is applied to the surface of the rubber substrate layer, dropping or breakage of the surface particles occurs so that it cannot be used for the portion with a high surface pressure or high stress, which is a future problem.

3. Manufacturing Method of Developing Roll for Forming Image Forming Apparatus According to the Present Invention The manufacturing method of a developing roll for forming an image forming apparatus according to the present invention is in a manufacturing method of a developing roll for forming an image forming apparatus by coating and forming a rubber substrate layer around a core material, then, forming a coating layer around the rubber substrate layer, the method comprises mixing and dispersing a binder containing at least a polyol, an isocyanate compound and reactive silicone oil, and the component of the above-mentioned coating layer containing a diluting solvent to prepare a dispersion, then, mixing and dispersing rubber particles having a hardness (JIS K6253: 1997) by Durometer A (instantaneous) of 20 to 80 degree and comprising spherical silicone rubber particles of 0.2 μm or more and less than 10 μm to the dispersion to prepare a dispersion for coating, and coating the dispersion for coating at around the above-mentioned elastic rubber layer and curing the same after drying to form a coating layer.

In the present invention, when the coating layer is formed, it is preferred that, after coating the dispersion for coating, a liquid state is maintained for a certain period of time to move the rubber particles to an upper layer portion of the layer and then it is cured.

In the present invention, when the rubber particles is to be moved into an upper layer portion of the layer, it is preferred that the rubber particles are so moved that the surface becomes such a state that a changed ratio of surface exposed particles before and after curing the coating layer obtained by the following calculation formula becomes 500% or more.

Calculation Formula of Changed Ratio of Surface Exposed Particles

Changed ratio of surface particles=(Number of surface particles after curing−number of surface particles before curing)/number of surface particles before curing×100%

(Here, the number of the surface particles is a value by photographing optional three portions of a surface of a coating layer with a magnification of 3,000-fold using a laser microscope "VK-9700" manufactured by Keyence Corporation and measuring a number of rubber particles in the range of 50 μm×50 μm of an image.)

The rubber member for coating a developing roll of the present invention can be obtained by subjecting to coating constitutional starting materials of the above-mentioned coating layer, drying and/or baking.

Depending on the rubber substrate layer at the surface of the developing roll on which the coating layer is to be formed, it is preferred that an adhesive (primer) may be previously coated before coating the rubber member of the present invention.

The coating method is not particularly limited, and can be carried out by the conventionally known coating method such as a dipping method, a spray method, a roll coating method, a doctor blade method, a flow coating method, etc.

The drying conditions can be optionally set, and preferably carried out at a room temperature to 150° C. for 5 to 20 minutes.

Baking may not be carried out in some cases, and preferably carried out at room temperature to 230° C. for 5 to 120 minutes, which can be optionally set depending on heat resistance of the rubber.

By blending silicone rubber particles and a binder together, uniformly dispersing therein, and coating it onto the surface of the rubber substrate layer, the coating layer surface can be made uniform surface roughness, and also the coating layer can be maintained soft and can be made low tackiness and low friction.

Even if the binder is hard, the coating layer itself becomes soft by formulating the silicone rubber particles. The silicone rubber particles at the projected part which are in contact with a mating member (for example, toner) are soft, become in a point contact, less dependent on the hardness of the binder, whereby stress to the counterpart surface can be reduced and can be made low tackiness and low friction.

Since they are rubber particles, in the rubber member for coating a developing roll, the resin component used for the toner component and the silicone are not adhered, and they become a point contact by the projection of the silicone rubber particles, whereby contact and stress of the toner particles are reduced to prevent from deterioration of the toner.

When the projection is formed by the resin particles as in the conventional art, the surface is hard so that flexibility, etc., are impaired whereby stress to the toner is applied.

In addition, rubber particles other than the silicone, such as EPDM, SBR, urethane, etc., are used, they have tackiness so that they are not preferred.

In the present invention, it is preferred that the surface of the above-mentioned coating layer is formed in a projected state by the presence of the above-mentioned rubber particles, the above-mentioned interval between the rubber particles is less than 5 μm, and the above-mentioned rubber particles are present in the state that 5 or more articles are aggregated. As the interval between the rubber particles formed in the projected state is shorter, it becomes the surface structure that the toner is not incorporated into the portion between the rubber particles or an opening portion, so that it is preferred.

For making an interval into which the toner is not incorporated into the silicone rubber particles, it can be applied a method in which several kinds of large and small particles are combined, and subjecting to closest packing by burying small particles between the gaps of the large particles, other than the particle size and the amount of the particles.

Spherical or substantially spherical rubber beads in the shape of the silicone rubber particles are used, the roll surface becomes further in a point contact, and the toner can be transferred without stress. At a low load, rubber particles which can maintain or recover the shape to spherical or substantially spherical are preferably used.

When the particles are blended into the binder, uniformly dispersed therein, and coating by spraying, etc., in the case of an inorganic material, PTFE, and resin particles, precipitation occurs in the coating liquid so that it is difficult to uniformly coat. In the case of the rubber particles, if a solvent by which the rubber particles swell is used, precipitation can be further reduced, and uniform coating can be carried out. In addition, by using the rubber, a viscosity of the coating agent is increased so that good coating property can be obtained.

By addition of the silicone rubber particles, friction and abrasion resistances are lowered, but it can be improved by adding a binder or a lubricating component.

EXAMPLES

Examples of the present invention are explained. The present invention is not limited by such Examples.

Example 1

Preparation of Coating Layer Constituting Solution (Coating Liquid)

| | |
|---|---|
| Fluorine-containing polyol (concentration of solid content: 50%) ("ZEFFLE GK510" available from Daikin Industries, Ltd.) | 35.0 parts by weight |
| Urethane-modified hexamethylene diisocyanate (concentration of solid content: 80%) ("Duranate E402-80B" available from Asahi Kasei Corporation) | 79.4 parts by weight |
| Reactive silicone oil ("X-22-160AS" available from Shin-Etsu Chemical Co., Ltd.) | 50.0 parts by weight |
| Diluting solvent; butyl acetate | 249.4 parts by weight |

The respective components mentioned above were mixed to prepare a dispersion in which the binder and the diluting solvent have been mixed.

With the prepared dispersion were mixed 14.6 parts by weight of silicone rubber particles (available from Dow Corning Toray Co., Ltd., "EP-2720": hardness (JIS K6253: 1997) by Durometer A (instantaneous) of 70 degree, average particle diameter: 2 μm (1 to 2 μm)) to prepare a dispersion (1) for coating.

Preparation of Rubber Coating Roller

To a shaft core material made of iron and having an outer diameter of 10 mm was coated a conductive silicone rubber having a volume resistivity (JIS C2139 (2008)) of 106 Ωcm and a hardness (JIS K6253: 1997) by Durometer A (instantaneous) of 45 degree, and 10-point average roughness according to JIS B0601 (1994) was adjusted to 8 μm (Ry) by polishing with a cylindrical grinding machine to form a rubber substrate layer having an outer diameter of 16 mm, which was made a rubber coating roller.

Preparation of Rubber Member for Coating Developing Roll and Developing Roller

The above-mentioned dispersion (1) for coating was previously dispersed by a bead mill under high speed stirring, then, further stirred by a stirrer for 10 minutes to prepare a dispersion (2) for coating.

"KBP-40" available from Shin-Etsu Silicone Co., Ltd., was spray coated as a primer onto the surface of the above-mentioned rubber coating roller, then, the above-mentioned dispersion (2) for coating was spray coated on the coated surface.

Thereafter, the coated film was cured by heating at 160° C. for 40 minutes to form a rubber member for coating a developing roll which is a coating layer to manufacture a developing roller.

The thickness of the surface coating layer at this time was as shown in Table 1.

Evaluation Methods

The rubber member for coating a developing roll obtained in Example 1 was evaluated by the following items, and the results were shown in Table 1.

(1) Coefficient of Dynamic Friction

According to ASTM D-1894 (JIS K7125: 1999, ISO8295: 1995), the dispersion (2) for coating obtained as mentioned above was spray-coated onto the rubber sheet surface having a thickness of 2 mm with a thickness (thickness of surface coating layer: μm) as shown in Table 1, and after baking, its coefficient of dynamic friction was measured by using a surface property tester "Heidon TriboGear" manufactured by Shinto Scientific Co., Ltd. The results were shown in Table 1.

(Test Conditions)
  Counterpart member: SUS304 steel balls having a diameter of 10 mm,
  Moving speed: 50 mm/min,
  Load: 0.49N,
  Amplitude: 50 mm (2) Evaluation of Adhesiveness by Cross-Cut Test With regard to the resulting rubber member for coating a developing roll, according to JIS K5600-5-6: 1999 (ISO2409: 1992), after cross-cut test, a peeling test by a tape was carried out and adhesiveness was evaluated by the following criteria, and the results were shown in Table 1.

Evaluation Criteria
  ○: No peeling of the coating film at bent part, and no waving at cutting lines
  Δ: No peeling of the coating film at bent part, but there is waving at cutting lines
  x: There is peeling of the coating film at bent part (3) Evaluation of Flexibility by Elongation Test After a primer was coated to the above-mentioned rubber coating roller surface, the dispersion (2) for coating was so spray coated that the thickness thereof became 10 μm, and baked to form a rubber member for coating.

The surface layer (coating layer) of the resulting rubber member for coating was sliced to a thickness of 5 mm to form a rubber sheet, and at the state that the sheet was elongated with 50%, the sheet was observed with naked eyes whether it is changed to a white color or not. In addition, whether crack was caused at the sheet (coating layer) or not was observed by a microscope and evaluated by the following criteria, and the results were shown in Table 1.

Evaluation Criteria
  ○: No crack of the coating layer and no white color change
  Δ: Crack is present at the coating layer and there is white color change
  x: Crack of the coating layer is remarkable and there is white color change (4) Evaluation of Height of Surface Projected Parts The surface of the rubber member coating layer was photographed with a magnification of 1,000-fold and 3,000-fold by using a laser microscope "VK-9700" manufactured by Keyence Corporation, a height of the particle projected parts from the surface of the coating layer was evaluated, and the results were shown in Table 1.

When it is 0.5 μm or more and less than 8 μm, it is preferred as the height of the projected parts of the rubber member according to the present invention, and when it is less than 0.5 μm or 8 μm or more, it is not preferred.

(5) Evaluation of Interval Between Rubber Particles at the Surface and Dispersed State The surface of the rubber member coating layer was photographed with a magnification of 1,000-fold and 3,000-fold by using a laser microscope "VK-9700" manufactured by Keyence Corporation to measure the interval between the rubber particles, and the results were shown in Table 1.

When the interval between the rubber particles is 5 μm or less, it is preferred, while the interval between the rubber particles is apart than 5 μm, then, it is not preferred.

Simultaneously, dispersed state of the particles observed by the microscope was evaluated by the following criteria, and the results were shown in Table 1.

Evaluation Criteria
  ○: There are 5 or more aggregated portions
  Δ: There are 4 or less aggregated portions
  x: Particles cannot be confirmed from the surface photograph (6) Particle Diameter/Coating Layer Thickness Single rubber particle at the coating layer surface was photographed with a magnification of 3,000-fold by using a laser microscope "VK-9700" manufactured by Keyence Corporation, an average particle diameter of 10 particles was obtained by the arithmetic mean of the particle sizes, and this is made the particle size.

Also, optional three portions of the developing roller to be measured were perpendicularly cut to the roll surface, and the collected cross-sectional sample was observed with a magnification of 3,000-fold by using a laser microscope "VK-9700" manufactured by Keyence Corporation to measure the thickness of the coating layer.

The value of the rubber particles diameter/coating layer thickness was calculated, and the results were shown in Table 1.

If the rubber particles diameter/coating layer thickness<0.3, it is preferred, while if the rubber particles diameter/coating layer thickness>0.3, it is not preferred.

(7) Evaluation of Number of Particles at Roll Surface

Optional three portions of the roller surface were photographed with a magnification of 3,000-fold by using a laser microscope "VK-9700" manufactured by Keyence Corporation. By photographing optional three portions, the contour of the projected parts by the formulated rubber particles was represented by a black color.

This portion in which the contour is a black color and a circularity of 0.5 or more is considered to be a rubber particle portion, a number of the rubber particles within the range of 50 μm×50 μm was countered and the results were shown in Table 1.

When the number of the rubber particles is 200 or more, it is preferred, while when it is less than 200, it is not preferred.

(8) Changed Ratio of Surface Exposed Particles Before and after Curing Coating Layer A number of the particles at the coating layer surface before curing was counted similarly to the above-mentioned "evaluation of number of particles at roll surface", and the changed ratio of the number of the exposed particles at the roll surface before and after curing was calculated by the following formula. The results were shown in Table 1.

(Number of surface particles after curing−number of surface particles before curing)/number of surface particles before curing×100%

When the obtained value is 900% or more, it can be judged that the particles are well transferred to the roll surface.

(9) Coating Layer Condition Before Curing Coating Layer

The dispersion (2) for coating was spray coated to the surface of the rubber substrate layer, and after drying at room temperature for 30 minutes, presence or absence of stickiness of the coating layer was confirmed by touching it with a finger and evaluated by the following criteria, and the results were shown in Table 1.

Evaluation Criteria
  ○: There is stickiness
  x: There is no stickiness

(10) Coating Layer Condition after Curing Coating Layer

The dispersion (2) for coating was spray coated to the surface of the rubber substrate layer, and then, the coated film was cured by the heat treatment at 160° C. for 40 minutes, and after allowing to stand at room temperature for 30 minutes, presence or absence of stickiness of the coating layer was confirmed by touching it with a finger and evaluated by the following criteria, and the results were shown in Table 1.

Evaluation Criteria
  ○: There is no stickiness
  x: There is stickiness

(11) Toner Conveying Amount

The toner which had been existed on a developing roll and passed through a developing blade was sucked, the toner held on a filter paper was weighed, and a toner amount per a unit area (mg/cm$^2$) was measured. The results were shown in Table 1.

The conveying amount is preferably 0.4 to 0.6 mg/cm$^2$, more preferably 0.4 to 0.55 mg/cm$^2$. If the amount is larger than the above, a toner consumed amount becomes large, which is not preferred. Also, as small as the conveying amount is, a torque consumption efficiency becomes good, but if it is less than 0.4 mg/cm$^2$, printing becomes thin, which is not preferred.

(12) Evaluation of Printing Vertical Stripes Image

An image failure in which toner sticking occurs at a developing blade by repeatedly sliding the toner with the developing blade to cause obstruction of toner supply at the toner sticking projected parts, which reveals as a vertical white striped pattern in the black solid image was evaluated.

The resulting rubber member (developing roll) was incorporated into a cartridge ("TN-27J" manufactured by Brother Industries, Ltd.) of a commercially available monochrome laser printer ("HL-2240D" manufactured by Brother Industries, Ltd.), a paper feeding endurance test was carried out under a low temperature and low humidity environment (15° C., 25% RH) with 1% concentration/sheet for 3,000 sheets, a black solid image was printed while each 500 sheets, and occurrence of vertical stripes was observed by naked eyes.

Judgment criteria of vertical stripes image failure was as follows. The judgment results were shown in Table 1.

Evaluation Criteria
  ○: No occurrence of vertical stripes at a fed paper number of 2,000 sheets.
  Δ: Vertical stripes occurred at a fed paper number of 1,500 sheets.
  x: Vertical stripes occurred at a fed paper number of 1,000 sheets or less.

(13) Evaluation of Image Density Maintenance

After printing a predetermined number of sheets, whether the toner can maintain a desired black solid image density or not was evaluated without causing sticking of a toner component to the surface of the developing roll due to repeated friction with a developing roll, a photoreceptor drum and a regulation blade, which is the so-called filming. The roll specification had been obtained the target density in the initial image.

A roll with the respective specifications was incorporated into a cartridge ("TN-27J" manufactured by Brother Industries, Ltd.) of a commercially available monochrome laser printer ("HL-2240D" manufactured by Brother Industries, Ltd.), a paper feeding endurance test was carried out under a low temperature and low humidity environment (15° C., 25% RH), with 1% concentration/sheet for 3,000 sheets. After printing for 2,500 sheets, an image pattern in which black solid portions had been provided at four portions of top, bottom, left and right of the paper was printed, measurement of a transmission density was carried out at 12 points in total (one black solid portion/3 points) by a black-and-white transmission densitometer ("X-rite310T" manufactured by X-Rite Inc.), and an average value thereof was calculated. The results were shown in Table 1.

If the image density is 1.9 or more, it can be evaluated that the image density is good.

(14) Horizontal White Stripe Image Evaluation (Filming Resistance) Test

A degree of an image defect in which a printed solid image appears as a horizontal white stripe image was evaluated which has been caused by inhibition of toner supply due to formation of concavity or a toner sticking projected parts by compression set at the contacting portion of the developing roll with the photoreceptor drum or the regulation blade, when printing is carried out under room temperature environment after storing under high temperature environment for a long period of time.

A roll with the respective specifications was incorporated into a cartridge (TN-27J manufactured by Brother Industries, Ltd.) of a commercially available monochrome laser printer (HL-2240D manufactured by Brother Industries, Ltd.), and in the state of mounting the cartridge to the drum unit, it was allowed to stand under a high temperature environment (40° C., 90% RH) for 120 hours. Thereafter, it was taken out and allowed to stand under normal temperature for 8 hours, then, 1 sheet of a black solid image, 20 sheets of a halftone image and 1 sheet of a black solid image were continuously printed.

Whether a periodic horizontal white stripe image had been occurred in the final black solid image or not was observed with naked eyes, and it was evaluated by the following criteria. The results were shown in Table 1.

Evaluation Criteria

○: No horizontal stripe
   ×: Horizontal stripe present

Example 2

A dispersion for coating was prepared in the same manner as in Example 1 except for changing 14.6 parts by weight of the silicone rubber particles (available from Dow Corning Toray Co., Ltd.) (Rubber hardness (JIS K6253: 1997) by Durometer A (instantaneous) of 70 degree, average particle diameter: 2 μm (1 to 2 μm)) to 6.9 parts by weight of the same.

Thereafter, a rubber substrate layer was prepared in the same manner as in Example 1, the resulting material was evaluated in the same manner as in Example 1, and the results were shown in Table 1.

Example 3

A dispersion for coating was prepared in the same manner as in Example 1 except for changing the silicone rubber particles (available from Dow Corning Toray Co., Ltd.) (Rubber hardness (JIS K6253: 1997) by Durometer A (instantaneous) of 70 degree, average particle diameter: 2 μm (1 to 2 μm)) to silicone rubber particles (available from Shin-Etsu Chemical Co., Ltd.) (Rubber hardness: (JIS K6253: 1997) by Durometer A (instantaneous) of 75 degree, average particle diameter: 2 μm (0.7 to 5 μm)).

Thereafter, a rubber substrate layer was prepared in the same manner as in Example 1 except for changing the thickness of the coating layer to 10 μm, the resulting material was evaluated in the same manner as in Example 1, and the results were shown in Table 1.

Example 4

A dispersion for coating was prepared in the same manner as in Example 1.

Thereafter, a rubber substrate layer was prepared in the same manner as in Example 1 except for changing the thickness of the coating layer to 10 μm, the resulting material was evaluated in the same manner as in Example 1, and the results were shown in Table 1.

Reference Example

A dispersion for coating was prepared in the same manner as in Example 1 except for changing the silicone rubber particles (available from Dow Corning Toray Co., Ltd.) (Rubber hardness (JIS K6253: 1997) by Durometer A (instantaneous) of 70 degree, average particle diameter: 2 μm (1 to 2 μm)) to silicone rubber particles (available from Shin-Etsu Chemical Co., Ltd.) (Rubber hardness (JIS K6253: 1997) by Durometer A (instantaneous) of 75 degree, average particle diameter: 2 μm (0.7 to 5 μm)).

Thereafter, a rubber substrate layer was prepared in the same manner as in Example 1 except for changing the thickness of the coating layer to 5 μm, the resulting material was evaluated in the same manner as in Example 1, and the results were shown in Table 1.

Comparative Example 1

A dispersion for coating was prepared in the same manner as in Example 1 except for changing 14.6 parts by weight of the silicone rubber particles (available from Dow Corning Toray Co., Ltd.) (Rubber hardness (JIS K6253: 1997) by Durometer A (instantaneous) of 70 degree, average particle diameter: 2 μm (1 to 2 μm)) to 0 part by weight of the same.

Thereafter, a rubber substrate layer was prepared in the same manner as in Example 1, the resulting material was evaluated in the same manner as in Example 1, and the results were shown in Table 1.

Comparative Example 2

A dispersion for coating was prepared in the same manner as in Example 1 except for changing the silicone rubber particles (available from Dow Corning Toray Co., Ltd.) (Rubber hardness (JIS K6253: 1997) by Durometer A (instantaneous) of 70 degree, average particle diameter: 2 μm (1 to 2 μm)) to silicone rubber particles (available from Momentive Performance Materials Inc.) (Rubber hardness (JIS K6253: 1997) by Durometer A (instantaneous) of 95 degree, average particle diameter: 2 μm (1 to 3 μm)).

Thereafter, a rubber substrate layer was prepared in the same manner as in Example 1, the resulting material was evaluated in the same manner as in Example 1, and the results were shown in Table 1.

Comparative Example 3

A dispersion for coating was prepared in the same manner as in Example 1 except for changing the silicone rubber particles (available from Dow Corning Toray Co., Ltd.) (Rubber hardness (JIS K6253: 1997) by Durometer A (instantaneous) of 70 degree, average particle diameter: 2 μm (1 to 2 μm)) to silicone rubber particles (available from Shin-Etsu Chemical Co., Ltd.) (Rubber hardness (JIS K6253: 1997) by Durometer A (instantaneous) of 30 degree, average particle diameter: 5 μm (1 to 15 μm)).

Thereafter, a rubber substrate layer was prepared in the same manner as in Example 1, the resulting material was evaluated in the same manner as in Example 1, and the results were shown in Table 1.

Comparative Example 4

A dispersion for coating was prepared in the same manner as in Example 1 except for changing 50.0 parts by weight of the reactive silicone oil to 0 part by weight of the same, and 14.6 parts by weight of the silicone rubber particles (available from Dow Corning Toray Co., Ltd.) (Rubber hardness (JIS K6253: 1997) by Durometer A (instantaneous) of 70 degree, average particle diameter: 2 μm (1 to 2 μm)) to 3.1 parts by weight of the same.

Thereafter, a rubber substrate layer was prepared in the same manner as in Example 1, the resulting material was evaluated in the same manner as in Example 1, and the results were shown in Table 1.

Comparative Example 5

A dispersion was prepared as follows.

With 100 parts by weight of polytetramethylene glycol ("PTG1000SN" available from Hodogaya Chemical Co., Ltd.) was stepwisely mixed 21.2 parts by weight of an isocyanate ("Millionate MT" available from Nippon Polyurethane Industry Co., Ltd.) in a methyl ethyl ketone solvent, and the mixture was reacted under nitrogen atmosphere at 80° C. for 6 hours to prepare a polyurethane polyol prepolymer.

To 100 parts by weight of the above-mentioned polyurethane polyol prepolymer was added 7.2 parts by weight of an isocyanate ("Takenate B830" available from Mitsui Takeda Chemicals Inc.; TMP-modified TDI, f (number of average functional groups)=corresponding to 3) to make an NCO equivalent 1.2.

Further, 277.9 parts by weight of butyl acetate was added to the mixture as an organic solvent to make a concentration of the solid content 30%, to prepare a dispersion.

To the prepared dispersion was added 30 parts by weight of composite silicon powder ("KMP-601" available from Shin-Etsu Chemical Co., Ltd.; volume average particle diameter: 15 μm) as core/shell particles based on 70 parts by weight of the concentration of the solid contents, and the mixture was stirred by a propeller blade to prepare a coating liquid.

Thereafter, a rubber substrate layer was prepared in the same manner as in Example 1, the resulting material was evaluated in the same manner as in Example 1, and the results were shown in Table 1.

Comparative Example 6

A coating liquid was prepared in the same manner as in Comparative example 5 except for changing, as the core/shell particles, the composite silicon powder (KMP-601 available from Shin-Etsu Chemical Co., Ltd.; volume average particle diameter: 15 μm) to composite silicon powder ("X-52-7030" available from Shin-Etsu Chemical Co., Ltd.; volume average particle diameter: 1.0 μm).

Thereafter, a rubber substrate layer was prepared in the same manner as in Example 1, the resulting material was evaluated in the same manner as in Example 1, and the results were shown in Table 1.

Comparative Example 7

To 75 parts by weight of a urethane resin (Sanprene C-810S available from Sanyo Chemical Industries, Ltd.; concentration of solid content: 60%) was added 420 parts by weight of butyl acetate as a diluting solvent, which was used as a dispersion.

To the dispersion thus prepared was added 5 parts by weight of silicone rubber particles (available from Shin-Etsu Chemical Co., Ltd.) (Rubber hardness (JIS K6253: 1997) by Durometer A (instantaneous) of 75 degree, average particle diameter: 2 μm (0.7 to 5 μm)) to prepare a coating liquid.

Thereafter, a rubber substrate layer was prepared in the same manner as in Example 1 and the resulting material was evaluated in the same manner as in Example 1, and the results were shown in Table 1.

TABLE 1

| | | Example 1 | Example 2 | Example 3 | Example 4 | Reference example | Comparative example 1 |
|---|---|---|---|---|---|---|---|
| Formulation ratio | Fluorine-containing polyol | 35.0 | 35.0 | 35.0 | 35.0 | 35.0 | 35.0 |
| | (Solid content concentration: 50%) | (12.0) | (12.7) | (12.0) | (12.0) | (12.0) | (13.3) |
| | Urethane-modified hexamethylene diisocyanate | 79.4 | 79.4 | 79.4 | 79.4 | 79.4 | 79.4 |
| | (Solid content concentration: 80%) | (43.6) | (46.0) | (43.6) | (43.6) | (43.6) | (48.5) |
| | Reactive silicone oil | 50.0 | 50.0 | 50.0 | 50.0 | 50.0 | 50.0 |
| | | (34.3) | (36.3) | (34.3) | (34.3) | (34.3) | (38.2) |
| | Polyurethane polyol | — | — | — | — | — | — |
| | (Solid content concentration: 100%) | | | | | | |
| | Urethane | — | — | — | — | — | — |
| | (Solid content concentration: 60%) | | | | | | |
| | Isocyanate | — | — | — | — | — | — |
| | (Solid content concentration: 100%) | | | | | | |
| | Butyl acetate | 249.4 | 249.4 | 249.4 | 249.4 | 249.4 | 249.4 |
| | Silicone rubber particle | 14.6 | 6.9 | — | 14.6 | — | — |
| | (Rubber hardness: 70) | (10) | (5) | | (10) | | |
| | (Average particle diameter: 2 μm) (1 to 2 μm) | | | | | | |
| | Silicone rubber particle | — | — | 14.6 | — | 14.6 | — |
| | (Rubber hardness: 75) | | | (10) | | (10) | |
| | (Average particle diameter: 2 μm) (0.7 to 5 μm) | | | | | | |
| | Silicone resin particle | — | — | — | — | — | — |
| | (Rubber hardness: 95 or more) | | | | | | |
| | (Average particle diameter: 2 μm) (1 to 3 μm) | | | | | | |
| | Silicone rubber particle | — | — | — | — | — | — |
| | (Rubber hardness: 30) | | | | | | |
| | (Average particle diameter: 5 μm) (1 to 15 μm) | | | | | | |
| | Core/shell particle | — | — | — | — | — | — |
| | (Average particle diameter: 15 μm) (2 to 25 μm) | | | | | | |
| | Core/shell particle | — | — | — | — | — | — |
| | (Average particle diameter: 1 μm) (0.2 to 2 μm) | | | | | | |
| Total | | 438.4 | 420.7 | 438.4 | 438.4 | 438.4 | 413.8 |
| | | (100) | (100) | (100) | (100) | (100) | (100) |
| Solid content concentration: | | 34 | 33 | 34 | 34 | 34 | 32 |
| Surface coating layer thickness (μm) | | 7 | 7 | 10 | 10 | 5 | 7 |
| Dynamic friction coefficient | | 0.7 | 0.8 | 0.5 | 0.6 | 0.9 | 1.2 |
| Evaluation of adhesiveness by cross-cut adhesion test | | ◯ | ◯ | ◯ | ◯ | ◯ | ◯ |

TABLE 1-continued

|  | | | | | | |
|---|---|---|---|---|---|---|
| Evaluation of flexibility by elongation test | ○ | ○ | ○ | ○ | ○ | ○ |
| Evaluation of height of surface projected part (μm) | 1.5 | 1.5 | 1.0 | 1.5 | 2.0 | — |
| Interval (μm) between rubber particles | 2 or less | 2 or less | 2 or less | 2 or less | 2 or less | — |
| at the surface and dispersed state | ○ | ○ | ○ | ○ | ○ | |
| Particle diameter/coating layer thickness ratio | 0.29 | 0.29 | 0.29 | 0.29 | 0.4 | — |
| Number of particles at roll surface | 279 | 210 | 224 | 250 | 234 | — |
| Changed ratio (%) of surface exposed particles | 1016 | 1005 | 1020 | 900 | 1070 | — |
| Coating layer condition before curing coating layer | ○ | ○ | ○ | ○ | ○ | ○ |
| Coating layer condition after curing coating layer | ○ | ○ | ○ | ○ | ○ | ○ |
| Toner conveying amount (mg/cm$^2$) | 0.58 | 0.57 | 0.59 | 0.60 | 0.62 | 0.54 |
| Evaluation of printing vertical stripes image (sheets) | ○ | ○ | ○ | ○ | Δ | Δ |
| Evaluation of image density maintenance | 2.1 | 2.0 | 2.2 | 2.2 | 1.9 | 1.8 |
| Horizontal white stripe image failure | ○ | ○ | ○ | ○ | ○ | X |

| | | Comparative example 2 | Comparative example 3 | Comparative example 4 | Comparative example 5 | Comparative example 6 | Comparative example 7 |
|---|---|---|---|---|---|---|---|
| Formulation ratio | Fluorine-containing polyol | 35.0 | 35.0 | 35.0 | — | — | — |
| | (Solid content concentration: 50%) | (12.0) | (12.0) | (57.0) | | | |
| | Urethane-modified hexamethylene diisocyanate | 79.4 | 79.4 | 12.5 | — | — | — |
| | (Solid content concentration: 80%) | (43.6) | (43.6) | (33.0) | | | |
| | Reactive silicone oil | 50.0 | 50.0 | — | — | — | — |
| | | (34.3) | (34.3) | | | | |
| | Polyurethane polyol | — | — | — | 100.0 | 100.0 | — |
| | (Solid content concentration: 100%) | | | | (63) | (63) | |
| | Urethane | — | — | — | — | — | 75.0 |
| | (Solid content concentration: 60%) | | | | | | (90) |
| | Isocyanate | — | — | — | 7.2 | 7.2 | — |
| | (Solid content concentration: 100%) | | | | (7) | (7) | |
| | Butyl acetate | 249.4 | 249.4 | 52.0 | 277.9 | 277.9 | 420 |
| | Silicone rubber particle | — | — | 3.1 | — | — | — |
| | (Rubber hardness: 70) | | | (10) | | | |
| | (Average particle diameter: 2 μm) (1 to 2 μm) | | | | | | |
| | Silicone rubber particle | — | — | — | — | — | 5 |
| | (Rubber hardness: 75) | | | | | | (10) |
| | (Average particle diameter: 2 μm) (0.7 to 5 μm) | | | | | | |
| | Silicone resin particle | 14.6 | — | — | — | — | — |
| | (Rubber hardness: 95 or more) | (10) | | | | | |
| | (Average particle diameter: 2 μm) (1 to 3 μm) | | | | | | |
| | Silicone rubber particle | — | 14.6 | — | — | — | — |
| | (Rubber hardness: 30) | | (10) | | | | |
| | (Average particle diameter: 5 μm) (1 to 15 μm) | | | | | | |
| | Core/shell particle | — | — | — | 11.9 | — | — |
| | (Average particle diameter: 15 μm) (2 to 25 μm) | | | | (30) | | |
| | Core/shell particle | — | — | — | — | 11.9 | — |
| | (Average particle diameter: 1 μm) (0.2 to 2 μm) | | | | | (30) | |
| Total | | 438.4 | 438.4 | 102.6 | 397.0 | 397.0 | 500 |
| | | (100) | (100) | (100) | (100) | (100) | (100) |
| Solid content concentration: | | 34 | 34 | 30 | 30 | 30 | 10 |
| Surface coating layer thickness (μm) | | 7 | 7 | 7 | 10 | 10 | 7 |
| Dynamic friction coefficient | | 0.5 | 0.7 | 1.5 | 1.0 | 1.5 | 0.4 |
| Evaluation of adhesiveness by cross-cut adhesion test | | ○ | ○ | ○ | ○ | ○ | ○ |
| Evaluation of flexibility by elongation test | | Δ | ○ | X | Δ | Δ | X |
| Evaluation of height of surface projected part (μm) | | 1.0 | 5.0 | 1.0 | 10.0 | 1.0 | 0.5 |
| Interval (μm) between rubber particles | | 10 | 6 | 2 or less | 7 | 2 or less | 7 |
| at the surface and dispersed state | | Δ | Δ | ○ | Δ | ○ | Δ |
| Particle diameter/coating layer thickness ratio | | 0.29 | 1.86 | 0.29 | 1.5 | 1.0 | 0.2 |
| Number of particles at roll surface | | 200 | 56 | 80 | 300 | 150 | 60 |
| Changed ratio (%) of surface exposed particles | | 506 | 406 | 400 | 450 | 300 | 200 |
| Coating layer condition before curing coating layer | | ○ | ○ | ○ | ○ | ○ | X |
| Coating layer condition after curing coating layer | | ○ | ○ | ○ | ○ | ○ | ○ |
| Toner conveying amount (mg/cm$^2$) | | 0.50 | 0.67 | 0.60 | 0.70 or more | 0.40 | 0.40 |
| Evaluation of printing vertical stripes image (sheets) | | X | ○ | X | X | X | X |
| Evaluation of image density maintenance | | 1.8 | 1.8 | 1.8 | 2.2 | 1.9 | 1.8 |
| Horizontal white stripe image failure | | ○ | ○ | ○ | ○ | ○ | X |

Unit: Parts by weight, the number in the parentheses is % by weight of the solid content Evaluation When Examples and Comparative example 1 are compared to each other, it can be understood that coefficient of dynamic friction becomes large (lowering friction coefficient is insufficient) when no particle was contained. As a result, printing vertical stripes and horizontal stripes image failures (filming) can be observed at an early stage. Image density cannot be maintained.

When Examples and Comparative example 4 are compared to each other, when no reactive silicone oil was contained, coefficient of dynamic friction becomes large (lowering friction coefficient is insufficient), flexibility is poor, and it can be confirmed that a number of the particles at the roll surface becomes extremely little. As a result, printing vertical stripes can be observed at an early stage. Image density cannot be maintained.

When Examples and Comparative example 2 are compared to each other, when the rubber particles hardness by Durometer A (instantaneous) is 95 degree or more, flexibility is lowered, intervals between the rubber particles are broadened, and an aggregation state of the rubber particles with each other is not good. Printing vertical stripes are observed at an early stage, and an image density cannot be maintained.

This can be considered that the particles are not a rubber but a resin, and the particles are hard, so that a damage is exerted to the mating member or the toner, whereby deterioration of the toner is promoted.

When Examples and Comparative example 3 are compared to each other, the ratio of the particle size/thickness of coating layer is 1.86, a number of the particles at the surface is a little as 56, and the maximum particle diameter is 15 µm. This can be considered that gaps between the rubber particles at the coating layer surface become large, the toner is incorporated into the gaps, and toner stress becomes large whereby maintenance of an image density is poor.

Comparative example 5 and Comparative example 6 which did not use the coating layer component of the present invention and 3-fold of the core/shell particles were formulated to that of Examples showed high coefficients of dynamic friction and poor flexibility. This can be considered that they are inferior in the coefficient of dynamic friction and flexibility as compared to the coating layer component of the present invention, and thus, they are inferior in the printing vertical stripe image evaluation. With regard to Comparative example 5, the surface rubber particles are much, but this is considered by the reason that larger particles are used so that the surface projected parts are also large, and the rubber particles are formulated with a large amount. As can be seen from the changed ratio of the surface exposed particles before and after curing the coating layer, it is not caused by transferring the rubber particles to the surface. Therefore, in Comparative example 6 which uses smaller particles than that of Comparative example 5, the number of the surface particles becomes small.

Also, in Comparative example 7 in which the rubber particles are the same as those of Examples but a dispersion is different from the same, whereas a hardness, a particle diameter and a formulation amount of the rubber particles are the same as those of Examples, it is poor in flexibility, surface interval and a dispersed state of the rubber particles are bad. A number of the surface rubber particles became extremely little. This can be considered that the coating layer component was a material which had been immediately solidified so that the rubber particles had also been solidified without transferring to the surface.

Other Utilizable Industrial Field

In addition to the developing roll used for the developing apparatus of the toner developing system, it can be also used for a rubber member such as a charging roll, a blade, a fixing roll, a fixing belt, a feed roll, etc.

While the preferred embodiments of the devices and methods have been described in reference to the environment in which they were developed, they are merely illustrative of the principles of the inventions. The elements of the various embodiments may be incorporated into each of the other species to obtain the benefits of those elements in combination with such other species, and the various beneficial features may be employed in embodiments alone or in combination with each other. Other embodiments and configurations may be devised without departing from the spirit of the inventions and the scope of the appended claims.

EXPLANATIONS OF LETTERS OF NUMERALS

1: Developing roll
11: Core material
12: Rubber substrate layer
13: Coating layer
101: Rubber particles
2: Regulation blade
3: Feed roll
4: Photoreceptor
5: Toner

We claim:

1. A rubber member for coating a developing roll which is obtained by coating a coating layer component around a developing roll having a rubber substrate layer and curing the coating layer component, and the coating layer component comprises:
(A) a liquid binder containing at least a polyol, an isocyanate compound and reactive silicone oil,
(B) silicone rubber particles having a hardness according to JIS K6253: 1997 by Durometer A, measured instantaneously, of 20 to 80 degrees, and a rubber particle size of 0.2 to 10 µm, and
(C) a diluting solvent, and
a ratio of a thickness of the coating layer after curing and a particle size of the rubber satisfies: the rubber particle size/a coating layer thickness <0.3.

2. The rubber member for coating a developing roll according to claim 1, wherein the diluting solvent used is a diluting solvent which swells the rubber particles.

3. The rubber member for coating a developing roll according to claim 1, wherein the polyol is a fluorine-containing polyol.

4. The rubber member for coating a developing roll according to claim 1, wherein the rubber particles are present in an amount of 200 or more per 50 µm2 at the surface of the coating layer.

5. The rubber member for coating a developing roll according to claim 1, wherein a surface of the coating layer is formed to a projected state by the presence of the rubber particles, and a height of projected parts which constitute the projected state is in the range of 0.5 to 8.0 µm.

6. The rubber member for coating a developing roll according to claim 1, wherein a surface of the coating layer is formed to a projected state by the presence of the rubber particles, an interval between the rubber particles is less than 5 µm, and the rubber particles are present in a state that 5 or more particles are aggregated.

7. A manufacturing method of a developing roll for forming an image forming apparatus comprising the steps of:

applying a rubber substrate layer around a core material;

mixing and dispersing a binder containing at least a polyol, an isocyanate compound and reactive silicone oil, and the component of the coating layer containing a diluting solvent to prepare a dispersion;

mixing and dispersing rubber particles having a hardness according to JIS K6253: 1997 by Durometer A, measured instantaneously, of 20 to 80 degrees and spherical silicone rubber particles between 0.2 μm and 10 μm to prepare a coating composition; and forming a coating layer by applying the coating composition around the rubber substrate layer, drying and curing the coating composition.

8. The manufacturing method of a developing roll for forming an image forming apparatus according to claim 7, wherein forming the coating layer further comprises maintaining a liquid state for a sufficient period of time to move the rubber particles to an upper layer portion of the layer before curing.

9. The manufacturing method of a developing roll for forming an image forming apparatus according to claim 8, wherein at the time of moving the rubber particles into an upper layer portion of the layer, the rubber particles are moved into the upper layer portion so that a changed ratio of surface exposed particles before and after curing the coating layer becomes 500% or more based on the following calculation:

changed ratio of surface exposed particles=(number of surface after curing−number of surface particles before curing)/number of surface particles before curing×100% wherein the number of surface particles is determined by photographing three portions of the surface of the coating layer with a magnification of 3,000-fold using a laser microscope and measuring a number of particles in the range of 50 μm×50 μm of the image.

* * * * *